(12) United States Patent
Kitayama

(10) Patent No.: US 8,565,036 B2
(45) Date of Patent: Oct. 22, 2013

(54) SEMICONDUCTOR MEMORY DEVICE INCLUDING PULL-DOWN TRANSISTORS FOR NON-SELECTED WORD LINES

(75) Inventor: Makoto Kitayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 265 days.

(21) Appl. No.: 13/067,140

(22) Filed: May 11, 2011

(65) Prior Publication Data

US 2011/0286262 A1 Nov. 24, 2011

(30) Foreign Application Priority Data

May 19, 2010 (JP) ................................ 2010-115338

(51) Int. Cl.
*G11C 7/00* (2006.01)

(52) U.S. Cl.
USPC ......... 365/204; 365/63; 365/205; 365/230.06

(58) Field of Classification Search
USPC ............................... 365/63, 204, 205, 230.06
See application file for complete search history.

(56) References Cited

U.S. PATENT DOCUMENTS

| | | | | |
|---|---|---|---|---|
| 6,055,203 A | * | 4/2000 | Agarwal et al. | 365/230.06 |
| 7,345,946 B1 | * | 3/2008 | Chapman et al. | 365/230.06 |
| 7,764,553 B2 | * | 7/2010 | Riho | 365/189.09 |
| 2002/0138688 A1 | * | 9/2002 | Hsu et al. | 711/105 |
| 2003/0002315 A1 | * | 1/2003 | Ooishi | 365/63 |
| 2003/0031066 A1 | * | 2/2003 | Yanagisawa et al. | 365/200 |
| 2004/0027907 A1 | * | 2/2004 | Ooishi | 365/226 |
| 2006/0013030 A1 | * | 1/2006 | Arimoto et al. | 365/63 |
| 2006/0098523 A1 | * | 5/2006 | Takita et al. | 365/230.06 |
| 2007/0165479 A1 | * | 7/2007 | Rehm | 365/230.06 |
| 2008/0253172 A1 | | 10/2008 | Yamagami | |

FOREIGN PATENT DOCUMENTS

JP 2008-262637 A 10/2008

* cited by examiner

*Primary Examiner* — Hoai V Ho
(74) *Attorney, Agent, or Firm* — McGinn IP Law Group, PLLC

(57) ABSTRACT

A semiconductor memory device includes a plurality of word lines wired in a first direction, a plurality of bit lines wired in a direction crossing the first direction, a memory cell array including a plurality of DRAM cells provided corresponding to intersections between the word lines and the bit lines, a word line driver which drives the word lines, and a plurality of word line potential stabilization transistors connected to the respective word lines and disposed on an opposite side of the word line driver with the memory cell array sandwiched between the word line potential stabilization transistors and the word line driver, each word line potential stabilization transistor turning on when the word line adjacent to a relevant one of the word lines is selected, thereby connecting the relevant word line to a non-selected potential, and turning off when the relevant word line is selected.

18 Claims, 9 Drawing Sheets

10 : SEMICONDUCTOR MEMORY DEVICE

20 : BANK

SEMICONDUCTOR MEMORY DEVICE INCLUDING PULL-DOWN TRANSISTORS FOR NON-SELECTED WORD LINES

REFERENCE TO RELATED APPLICATION

This application is based upon and claims the benefit of the priority of Japanese patent application No. 2010-11538, filed on May 19, 2010, the disclosure of which is incorporated herein in its entirety by reference thereto. The present invention relates to a semiconductor memory device. More specifically, the invention relates to a semiconductor memory device including DRAM cells.

BACKGROUND

1. Technical Field

The area of each cell of a memory such as a DRAM is increasingly reduced due to refinement of a fine processing technology and a cell structure. Implementation of a large-capacity semiconductor memory device thereby becomes possible. It has been proposed that, in the DRAM (dynamic random access memory) using 4F2 cells in particular, the area of each DRAM cell is reduced by using a three-dimensional structure. In this three-dimensional structure, a pillar-shaped projection is provided on a semiconductor substrate surface, a cell capacitance is connected to the top of the pillar-shaped projection, and the pillar-shaped projection is connected to a buried bit line provided on the foot of the pillar projection, through a cell transistor provided on a sidewall of the pillar-shaped projection.

Patent Document 1 describes a semiconductor integrated circuit which aims at improvement of a static noise margin characteristic. This semiconductor integrated circuit includes flip-flop type memory cells of an SRAM or the like. A pull-down circuit is provided for the semiconductor integrated circuit, for reducing a voltage of a word line to a supply voltage or less when the word line is active. The pull-down circuit is provided to prevent the voltage of the word line from excessively increasing, thereby aiming at improvement of the static noise margin characteristic.

[Patent Document 1]
JP Patent Kokai Publication No. JP2008-262637A, which corresponds to US Patent Application Publication No. 2008/0253172A1.

SUMMARY

The entire disclosure of Patent Document 1 is incorporated herein by reference thereto.
The following analysis is given by the present invention. As the fine processing technology develops, a relative parasitic capacitance between a selected word line and a non-selected word line adjacent to the selected word line increases. Then, a potential of the non-selected word line adjacent to the selected word line is affected by the parasitic capacitance between the selected and non-selected word lines. When the potential of the non-selected word line is affected in the DRAM, for example, a retention characteristic (refresh characteristic) of the DRAM cell deteriorates. In the case of the DRAM using 4F2 cells, in particular, a parasitic capacitance between word lines is relatively larger (than a capacitance with some other potential such as a ground potential) because of the cell structure. Accordingly, some measure needs to be taken.

A semiconductor memory device according to a first aspect of the present invention comprises: a plurality of word lines wired in a first direction; a word line driver which drives the word lines; and a plurality of word line potential stabilization transistors connected to respective ends of the word lines. Each word line potential stabilization transistor turns on when the word line adjacent to a relevant one of the word lines is selected, thereby connects the relevant word line to a stabilized potential, and turns off when the relevant word line is selected.

A semiconductor memory device according to a second aspect of the present invention comprises: a plurality of word lines wired in a first direction; a plurality of bit lines wired in a second direction crossing the first direction; a memory cell array including a plurality of DRAM cells provided corresponding to intersections between the word lines and the bit lines; a word line driver which drives the word lines; and a plurality of word line potential stabilization transistors connected to the respective word lines. The word line potential stabilization transistors are disposed on an opposite side of the first direction with respect to the word line driver with the memory cell array sandwiched between the word line potential stabilization transistors and the word line driver. Each word line potential stabilization transistor turns on when the word line adjacent to a relevant one of the word lines is selected, thereby connects the relevant word line to a non-selection potential and turns off when the relevant word line is selected.

A semiconductor memory device according to a third aspect of the present invention comprises: a plurality of word lines wired in a first direction; a word line driver which drives the word lines; and a plurality of word line potential stabilization transistors connected to respective ends of the word lines. Each word line potential stabilization transistor turns on when the word line adjacent to a relevant one of the word lines is selected, thereby connects the relevant word line to a stabilized potential, and turns off when the relevant word line is selected, at a time of data reading.

According to the present invention, the word line potential stabilization transistor is disposed at the end of each word line as seen from the word line driver, or on a side opposed to the word line driver with the memory cell array interposed between the word line driver and the word line potential stabilization transistor. The word line stabilization transistor turns on when the word line adjacent to the relevant word line is selected, thereby connecting the relevant word line to the stabilized potential. Accordingly, even if a parasitic resistance between the word lines is relatively large, the potential of the non-selected word line can be stabilized.

PREFERRED MODES

Figure 1:
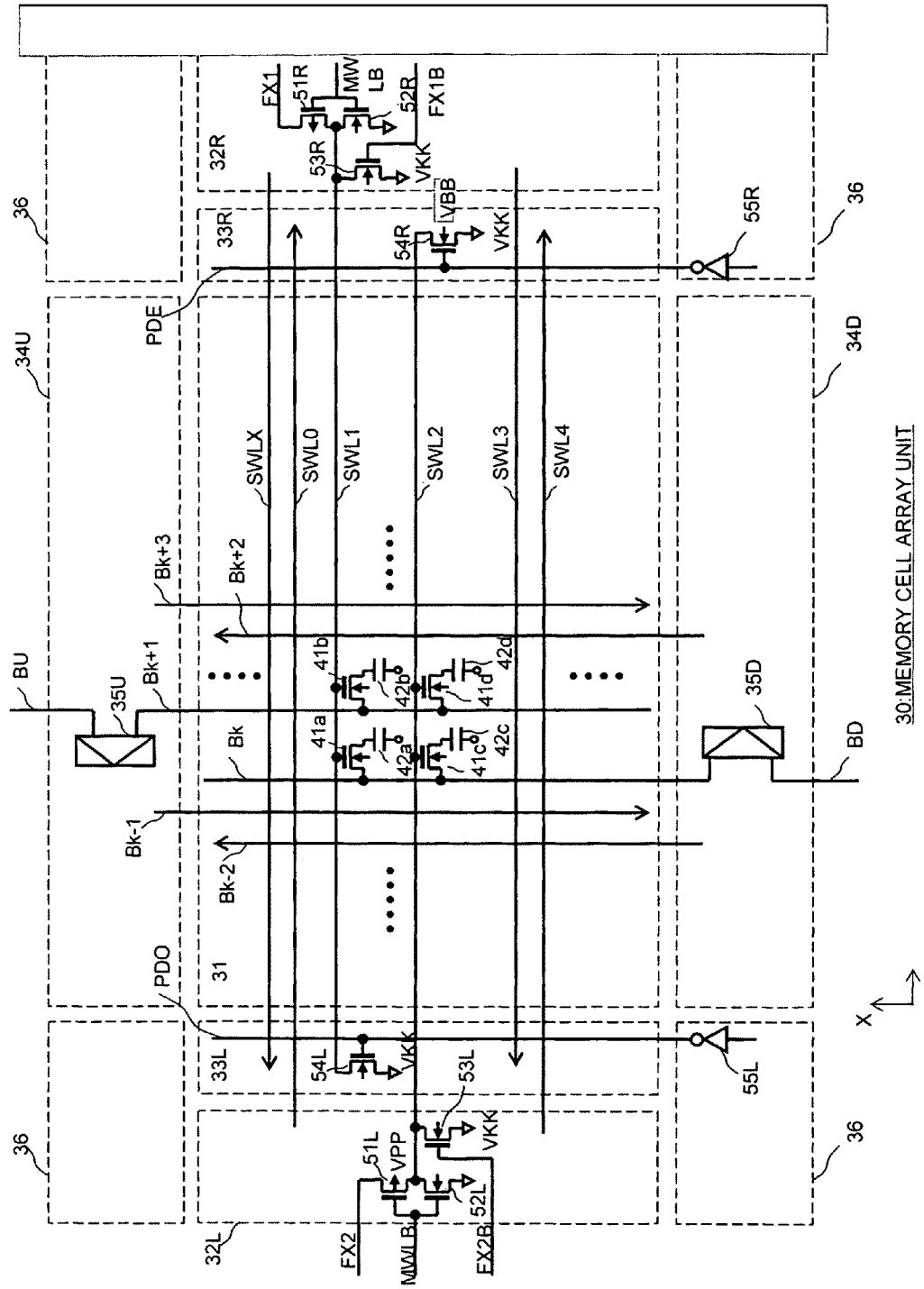
FIG. 1 is a block diagram of a memory cell array unit of a semiconductor memory device in a first example of the present invention.

An outline of an exemplary embodiment of the present invention will be described. In the exemplary embodiment, a word line potential stabilization transistor is provided at the end of a word line which will be driven by a word line driver. The word line potential stabilization transistor connects a potential of the word line to a stabilized potential (non-selection level) when an adjacent word to the word line is selected. The word line driver sets the word line to the non-selection level when the word line is not selected. The potential of the non-selected word line, however, floats up, being affected by a potential variation in the selected word line adjacent to the non-selected word line due to a parasitic capacitance between the word lines. This floating of the potential becomes manifest at the end of the word line rather than in the vicinity of the word line driver. When the semiconductor memory device is a DRAM, an increase in the potential of the non-selected word line causes a leak in terms of a cell Vt characteristic, thereby deteriorating a refresh characteristic. When the semiconductor memory device is an SRAM, an operating margin is reduced.

Assume the DRAM using a DRAM cell of a 4F2 structure in which dimensions in X and Y directions of the cell are both 2F and an area S per memory cell is given by $S=4\times F^2$ when the minimum feature size of the memory cell is set to F. In this DRAM, no contact such as that in a conventional structure of a DRAM cell (6F2 cell or 8F2 cell) is disposed between adjacent word lines (sub-word lines). The adjacent word lines (sub-word lines) corresponding to the length of a memory cell array (MAT) are wired side by side just through an interlayer film. The word lines are structured to sandwich a pillar formed on a semiconductor substrate (pillar or a region where the channel of a vertical-type MOS transistor is formed. Refer to reference numeral 71P in FIGS. 4, 5A and 5B. Details of the pillar will be described in an example). Thus, a ratio of a word line width to a word line pitch "2F" is large, so that an interval between the word lines is narrow (refer to reference numeral d in FIGS. 4, 5A and 5BB).

For this reason, when the DRAM cell of the 4F2 structure is used, a coupling capacitance component with the adjacent word line in an entire word line coupling capacitance component extraordinarily increases. Accordingly, when a word line is activated, a deactivated word line adjacent to the activated word line is subject to noise from the adjacent selected word line, and the potential of the word line which should be fixed to the non-selection level will float. It is effective to reduce the resistance of the word line so as to prevent the word line from floating. However, when the resistance of the word line is to be reduced by increasing the wiring width or thickness of the word line, a parasitic capacitance between the word lines will increase to the contrary.

To address this problem, in the semiconductor memory device in the exemplary embodiment, the word line potential stabilization transistor is connected to the end of a word line connected to the word line driver. Then, when an adjacent word line is selected, the word line potential stabilization transistor is turned on to fix the potential of the word line to a stabilized potential (non-selection level potential). Further, the word line potential stabilized transistor is controlled to turn off when the word line is selected.

Examples of the present invention will be described below in further detail with reference to the drawings.

First Example

Figure 2A:
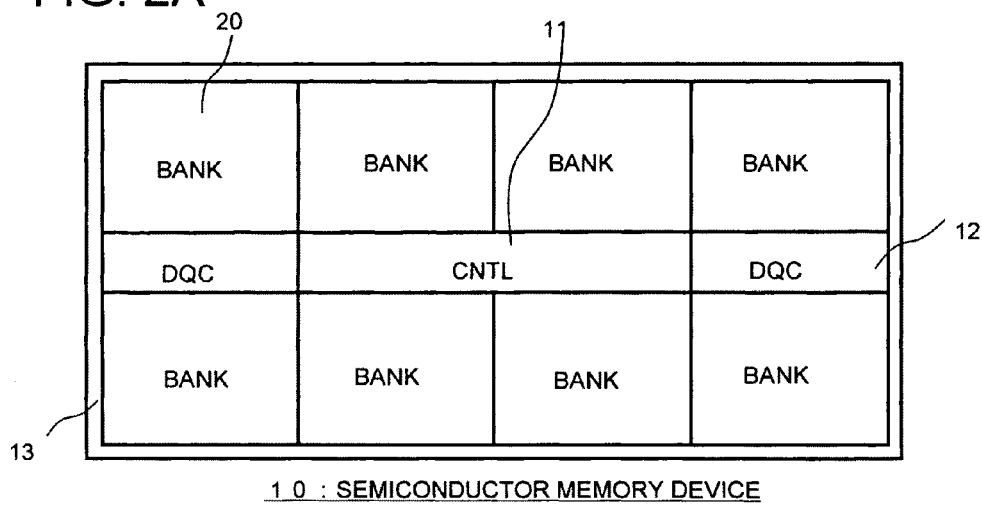
FIG. 2A is a block diagram of the overall semiconductor memory device in the first example.

FIG. 2A is a block diagram showing chip arrangement of an overall semiconductor memory device in a first example. A semiconductor memory device 10 in FIG. 2A is a DRAM (dynamic random access memory). The entire configuration of the semiconductor memory device 10 is broadly divided into a control (CNTL) circuit 11, input/output circuits (DQCs) 12, and memory banks (BANKs) 20. An outer peripheral unit 13 is provided outside around those components of semiconductor chips.

The control (CNTL) circuit 11 receives a clock, an address, and a control signal supplied from an outside of the semiconductor memory device 10, and determines an operation mode of the overall semiconductor memory device 10, predecodes the address, and the like.

Each input/output circuit (DQC) 12 includes an input/output buffer or the like. Write data is supplied to the input/output circuit (DQC) 12 from the outside of the semiconductor memory device 10, and the input/output circuit (DQC) 12 outputs read data to the outside of the semiconductor memory device 10.

Figure 2B:
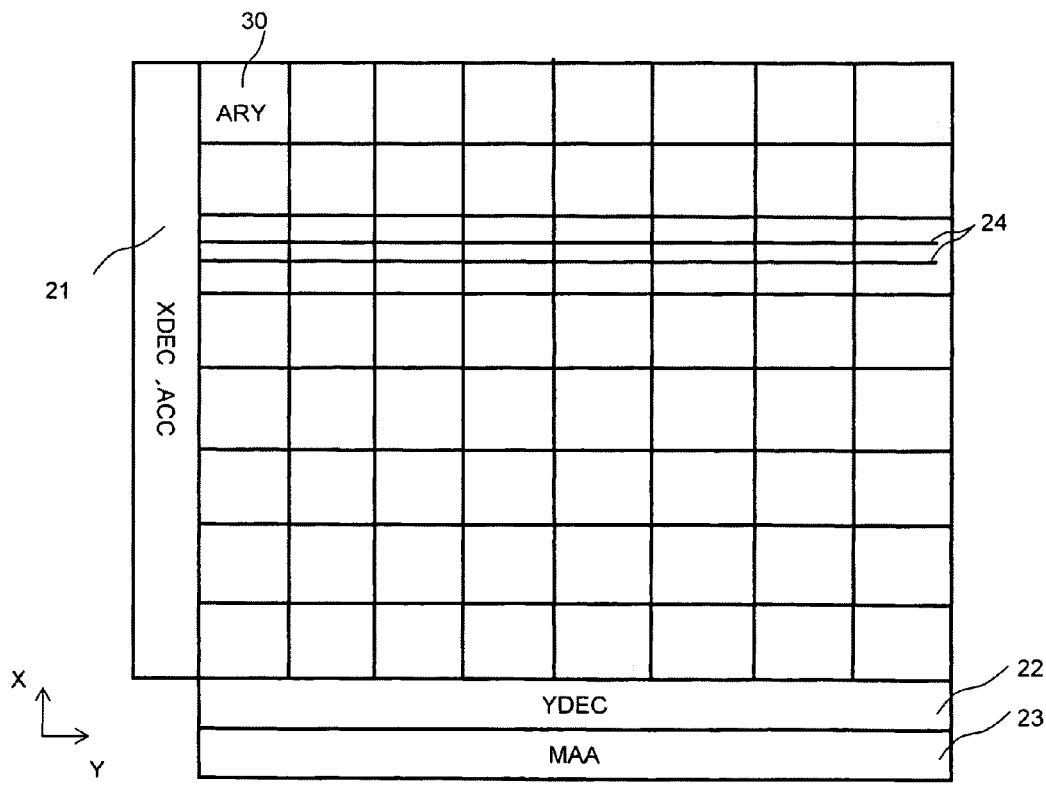
FIG. 2B is a block diagram showing an internal configuration of a memory bank.

A plurality of memory cell array units 30 are arranged in a matrix form in each memory bank (BANK) 20, as shown in FIG. 2B. As will be described later in detail, each memory cell array unit 30 includes, in addition to a memory cell array, peripheral circuits such as a sub-word line decoder, sub-word line stabilization circuits, sense amplifier units (sense amplifier arrays), and cross areas provided for each memory cell array. The necessary numbers of columns and rows of the memory array units 30 provided in the matrix form within the memory bank 20 are just provided according to a necessary memory capacity.

An X decoder (row decoder) and access control circuit (XDEC, ACC) 21 is provided for an outer peripheral portion of a Y direction (horizontal-axis direction) end of the memory bank (BANK) 20. A plurality of main word lines 24 are wired from the X decoder and access control circuit 21 to the memory array units 30 arranged in each Y direction. FIG. 2B illustrates only a part of the main word lines. The X decoder and access control circuit 21 activates one of the main word lines selected from among the main word lines 24, based on a row address supplied from the outside. Activation of the main word line 24 is performed under control of the access control circuit.

A column decoder (YDEC) 22 and a main amplifier array (MAA) 23 are provided for an outer peripheral portion of an X direction (vertical-axis direction) end of the memory bank (BANK) 20. The column decoder (YDEC) 22 controls reading from and writing to a selected one of the memory banks, based on a column address supplied from the outside. The main amplifier array 23 amplifies data to be written to the memory cell array unit 30 from the outside and transmits the data to the memory cell array unit 30, and amplifies data read from the memory cell array unit 30 and outputs the amplified data to the outside.

Next, an internal configuration and an operation of the memory cell array unit 30 will be described, using FIG. 1.

Each memory cell array unit 30 includes a memory cell array 31 and the peripheral circuits of the memory cell array 31. The peripheral circuits include sub-word line driver units 32L and 32R and sub-word line potential stabilization circuits 33L and 33R disposed on both sides of the memory cell array 31 in the Y direction (horizontal-axis direction), and sense amplifier units 34U and 34D disposed on both sides of the memory cell array 31 in the X direction (vertical axis direction). The peripheral circuits further include cross areas 36 at corners each bordered by each of the sub-word line driver unit 32L and the sub-word line stabilization unit 33L and the sub-word line driver unit 32R and the sub-word line stabilization unit 33R disposed in the Y direction, and a corresponding one of the sense amplifier units 34U and 34D disposed in the X direction. Each of the sense amplifier units 34U and 34D is shared by another one of the memory cell array units arranged in the matrix form. The another memory cell array unit is disposed adjacent to the memory cell array 30 in the X direction with a corresponding one of the sense amplifier units 34U' and 34D sandwiched between the memory cell array 30 and the another memory cell array unit.

A plurality of sub-word lines SWLX, SWL0 to SWL4 are wired within the memory cell array 31 in the Y direction. A plurality of bit lines Bk−2 to Bk+3 are wired in the X direction in which each sub-word line crosses. The number of sub-word lines and the number of bit lines per memory cell array can be set according to the necessary capacity of the memory. FIG. 1 illustrates only a part of the sub-word lines and only a part of the bit lines.

DRAM cells each including one of cell transistors 41a to 41d and one of cell capacitances 42a to 42d are connected at intersections between the respective sub-word lines SWLX and SWL0 to SWL4 and the respective bit lines Bk−2 to Bk+3. One of source/drain ends of each of the memory cell transistors 41a to 41d is connected to the corresponding bit line, and the other of the source/drain ends of each of the memory cell transistors is connected to the other end of the cell capacitance with one end connected to a reference potential. A gate of each of the memory cell transistors 41a to 41d is connected to the corresponding sub-word line. Actually, the DRAM cells are provided corresponding to the intersections between the respective sub-word lines SWLX and SWL0 to SWL4 and the respective bit lines Bk−2 to Bk+3. Referring to FIG. 1, only four DRAM cells provided corresponding to the intersections between the respective sub-word lines SWL1 and SWL2 and the respective bit lines Bk and Bk+1. Description of the other DRAM cells provided for the intersections between the respective other sub-word lines and the respective other bit lines is omitted.

The sub-word line driver units 32L and 32R are provided on both sides of the memory cell array 31 in the Y direction. The sub-word lines SWLX and SWL0 to SWL4 wired on the memory cell array 31 are alternately connected to the sub-word line driver units 32L and 32R, respectively. Accordingly, the sub-word lines (such as the sub-word lines SWL1 and SWL3) disposed adjacent to the sub-word line (such as the sub-word line SWL2) connected to the sub-word line driver unit 32L are not connected to the sub-word line driver unit 32L, but are connected to the sub-word line driver unit 32R. Similarly, the sub-word lines (such as the sub-word lines SWL0 and SWL2) disposed adjacent to the sub-word line (such as the sub-word line SWL1) connected to the sub-word line driver unit 32R are not connected to the sub-word line driver unit 32R, but are connected to the sub-word line driver unit 32L.

Each of the sub-word line driver units 32L and 32R includes a sub-word line driver provided for each of the sub-word lines. FIG. 1 illustrates only the sub-word line driver connected to the sub-word line SWL2 and the sub-word line driver connected to the sub-word line SWL1. An internal circuit configuration of each sub-word line driver will be described using the sub-word line driver connected to the sub-word line SWL2 as an example. The sub-word line driver includes a P-type MOS transistor 51L with a gate thereof connected to an inverted main word line MWLB, a source thereof connected to a sub-word selection line FX2 and a drain thereof connected to the sub-word line SWL2, an N-type MOS transistor 52L with a gate thereof connected to the inverted main word line MWLB and a source thereof connected to a power supply VKK, and a drain thereof connected to the sub-word line SWL2, and an N-type MOS transistor 53L with a gate thereof connected to a sub-word selection line FX2B, a source thereof connected to the power supply VKK, and a drain thereof connected to the sub-word line SWL2. The sub-word selection line FX2B is for a signal which is an inverted signal of a signal for the sub-word selection line FX2. The inverted main word line MWLB is a main word line which goes low when selected, and goes high when not selected. This sub-word line driver activates the sub-word line SWL2 to go high when the inverted main word line MWLB is low and the sub-word selection line FX2 is high. Otherwise, the sub-word line driver deactivates the sub-word line SWL2 to a VKK level. The power supply VKK is a power supply of a voltage (such as −0.4 V) further lower than a low-power supply voltage VSS given from the outside, and is the power supply generated inside the semiconductor memory device 10.

The sub-word line driver for driving the sub-word line SWL1 disposed at the sub-word line driver unit 32R also has a similar configuration to the sub-word line driver for driving the sub-word line SWL2. The sub-word line drivers are respectively provided for the sub-word lines which are driven by the sub-word line driver units 32L and 32R, respectively corresponding to the sub-word lines SWLX and SWL0 to SWL4. Though all of the sub-word line drivers have a same circuit configuration, an input signal for the inverted main word line MWLB or one of the sub-word selection lines (FX1, FX2, and the like) is different for each of the sub-word line drivers. One of the sub-word line drivers (sub-word line drivers in the sub-word-line driver unit 32L or 32R) provided for one memory cell array 31 is activated at a time, and only one sub-word line is selected at a time.

The sub-word line potential stabilization circuits 33L and 33R are provided between the respective sub-word line driver units 32L and 32R and the memory cell array 31. The end of each sub-word line with one end thereof connected to the sub-word line driver 32L extends to the sub-word line potential stabilization circuit 33R across the memory cell array 31, and is connected to a drain of a sub-word line potential stabilization transistor provided in the sub-word line potential stabilization circuit 33R. To take an example, the sub-word line SWL2 connected to the sub-word line driver unit 32L extends to the sub-word line potential stabilization circuit 33R across the memory cell array 31, and is connected to a drain of a sub-word line potential stabilization transistor 54R. A source of the sub-word line potential stabilization transistor 54R is connected to the power supply VKK, and a gate of the sub-word line potential stabilization transistor 54R is connected to a control signal PDE output by a stabilization circuit control signal generation circuit 55R disposed in a cross area 36. The sub-word line potential stabilization transistor 54R is an N-type MOS transistor. When the control signal PDE is high, the sub-word line potential stabilization transistor 54R turns on to pull down the corresponding sub-word line SWL2 to the voltage of the power supply VKK. When the control signal PDE is low, the sub-word line potential stabilization transistor 54R turns off.

Similarly, the end of each sub-word line with one end thereof connected to the sub-word line driver 32R extends to the sub-word line potential stabilization circuit 33L across the memory cell array 31, and is connected to a drain of a sub-word line potential stabilization transistor provided in the sub-word line potential stabilization circuit 33L. To take an example, the sub-word line SWL1 connected to the sub-word line driver unit 32R extends to the sub-word line potential stabilization circuit 33L across the memory cell array 31, and is connected to a drain of a sub-word line potential stabilization transistor 54L. A source of the sub-word line potential stabilization transistor 54L is connected to the power supply VKK, and a gate of the sub-word line potential stabilization transistor 54L is connected to a control signal PDO output by a stabilization circuit control signal generation circuit 55L disposed in a cross area 36. The sub-word line potential stabilization transistor 54L is an N-type MOS transistor. When the control signal PDO is high, the sub-word line potential stabilization transistor 54L turns on to pull down the corresponding sub-word line SWL1 to the voltage of the power supply VKK. When the control signal PDO is low, the sub-word line potential stabilization transistor 54L turns off.

The sense amplifier units 34U and 34D are respectively provided for ends of the memory cell array 31 in a bit line direction (X direction). Each of the sense amplifier units (sense amplifier arrays) 34U and 34D includes a plurality of sense amplifiers respectively connected to the corresponding bit lines Bk−2 to Bk+3. FIG. 1 illustrates only a sense amplifier 35U connected to the bit line Bk+1, and a sense amplifier 35D connected to the bit line Bk. The bit lines Bk−2 to Bk+3 are alternately connected to the sense amplifiers (35U, 35D, and the like) provided for the sense amplifier units 34U and 34D at both ends of the bit line direction, respectively.

In addition to being connected to the bit line Bk+1 of the memory cell array 31, the sense amplifier 35U is also connected to a bit line BU of another memory cell array disposed opposed to the memory cell array 31 with the sense amplifier unit 34U sandwiched between the memory cell array 31 and the another memory cell array. Similarly, in addition to being connected to the bit line Bk, the sense amplifier 35D is also connected to a bit line BD of another memory cell array disposed opposed to the memory cell array 31 with the sense amplifier unit 34D sandwiched between the memory cell array 31 and the another memory cell array.

The stabilization circuit control signal generation circuits 55L and 55R for respectively controlling the sub-word line potential stabilization circuits 33L and 33R are respectively provided in the cross areas 36. The stabilization circuit control signal generation circuit 55L decodes the sub-word selection lines (such as the sub-word selection line FX2), main word line, and the like supplied to the sub-word line driver unit 32L. When the sub-word line driver unit 32L activates one of the sub-word lines, the stabilization circuit control signal generation circuit 55L outputs the control signal PDO at a high level. When the sub-word line driver unit 32L does not activate any one of the sub-word lines, the stabilization circuit control signal generation circuit 55L outputs the control signal PDO at a low level (VKK level). That is, when the sub-word line driver unit 32L activates one of the sub-word lines, the stabilization circuit control signal generation circuit 55L controls the sub-word line potential stabilization circuit 33L so that the ends of the sub-word lines (SWLX, SWL1, SWL3, and the like) including the sub-word line adjacent to the sub-word line which will be activated are pulled down all together. The sub-word lines are connected to the sub-word line driver unit 32R disposed opposed to the sub-word line driver unit 32L with the memory cell array 31 sandwiched between the sub-word line driver unit 32R and the sub-word line driver unit 32L.

Similarly, the stabilization circuit control signal generation circuit 55R decodes the sub-word selection lines (such as the sub-word selection line FX1), main word line, and the like supplied to the sub-word line driver unit 32R. When the sub-word line driver unit 32R activates one of the sub-word lines, the stabilization circuit control signal generation circuit 55R outputs the control signal PDE at a high level. When the sub-word line driver unit 32R does not activate any one of the sub-word lines, the stabilization circuit control signal generation circuit 55R outputs the control signal PDO at a low level (VKK level). That is, when the sub-word line driver unit 32R activates one of the sub-word lines, the stabilization circuit control signal generation circuit 55R controls the sub-word line potential stabilization circuit 33R so that the ends of the sub-word lines (SWL0, SWL2, SWL4, and the like) including the sub-word line adjacent to the sub-word line which will be activated are pulled down all together. The sub-word lines are connected to the sub-word line driver unit 32L disposed opposed to the sub-word line driver unit 32R with the memory cell array 31 sandwiched between the sub-word line drive'r unit 32R and the sub-word line driver unit 32L.

Next, an operation of the memory cell array unit 30 in FIG. 1 will be described. Before a row address is supplied from the outside, none of the sub-word lines of the memory cell array 31 are selected, and the sub-word lines of the memory cell array 31 are set to a voltage which is the same as the voltage of the power supply VKK. In this state, electric charges stored in the capacitance of each memory cell in the memory cell array 31 are held.

Assume that the row address that, will be supplied from the outside is fixed, and the specific sub-word line (such as the sub-word line SWL2) is selected by the sub-word line driver units 32R and 32L. Then, the selected sub-word line (SWL2) is activated to output a high level. When the sub-word line stabilization circuits are not provided in that case, potentials of the sub-word lines (SWL1 and SWL3) adjacent to the sub-word line (SWL2) which will be activated float up with activation of the selected sub-word line (SWL2) because of parasitic capacitances between the sub-word lines.

However, by providing the sub-word line stabilization circuits 33L and 33R, the sub-word line stabilization circuits 33L and 33R fix potentials of the ends of the sub-word lines (SWL1, SWL3) adjacent to the sub-word line (SWL2) which will be activated to the potential of the VKK power supply. In the first example, circuits of the sub-word line stabilization circuits 33L and 33R are simplified. Thus, when the sub-word line driver unit 32L activates one of the sub-word lines, the stabilization circuit control signal generation circuit 55L activates the control signal PDO to fix a plurality of the sub-word lines with the ends thereof connected to the sub-word line stabilization circuit 33L to the potential of the power supply VKK all together. On the other hand, when the sub-word line driver unit 32R activates one of the sub-word lines, the stabilization circuit control signal generation circuit 55R activates the control signal PDE to fix a plurality of the sub-word lines with the ends thereof connected to the sub-word line stabilization circuit 33R to the potential of the power supply VKK all together. According to the control mentioned above, the ends of the sub-word lines not adjacent to the sub-word line which will be activated are also fixed to the potential of the power supply VKK. However, the potential of the sub-word line other than the sub-word line which will be activated is originally the potential of the power supply VKK. Thus, no particular problem occurs. With the above-mentioned circuit configuration, the potentials of the ends (that are the most distant from the sub-word line driver) of the sub-word lines which are not selected and are adjacent to the selected word line are fixed.

Figure 3A:
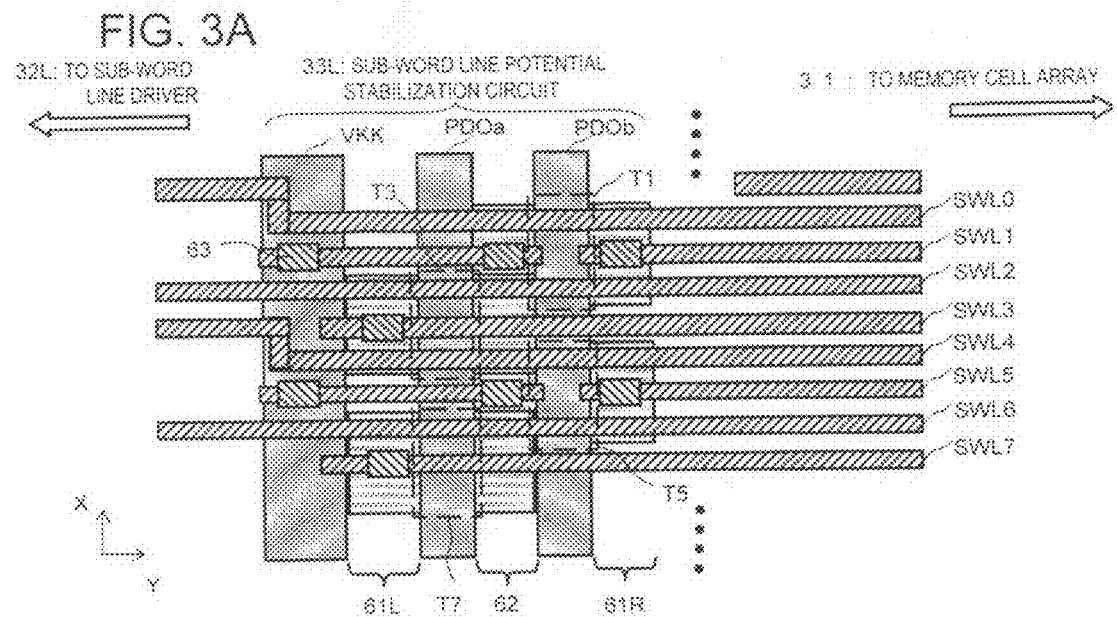
FIG. 3A is a layout diagram showing an example of circuit arrangement of a part of a word line potential stabilization circuit.
Figure 3B:
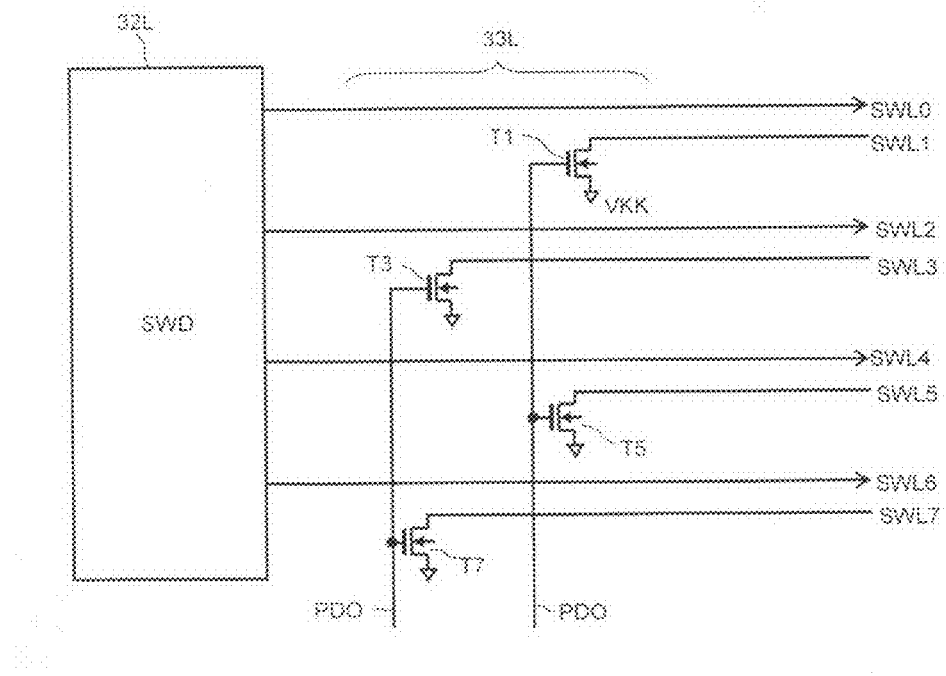
FIG. 3B is an equivalent circuit of FIG. 3A.

FIG. 3A is a layout diagram showing circuit arrangement of a part of the sub-word potential stabilization circuit 33L. FIG. 3B is an equivalent circuit diagram of FIG. 3A. Referring to FIG. 3A, the memory cell array 31 of the memory cells is disposed along the sub-word lines SWL0 to SWL7 beyond the range of the drawing on the right side of the page of FIG. 3A, and the sub-word line driver 32L is disposed beyond the range of the drawing on the left side of the page of FIG. 3A. The sub-word line potential stabilization circuit 33L is disposed between the memory cell array 31 and the sub-word line driver 32L. Each of the sub-word lines SW0 to SWL7 is connected to the memory cell array 31. Every other ones of the sequentially wired sub-word lines SW0 to SWL7, which are the sub-word lines SWL0, SWL2, SWL4, and SWL6 are connected to the sub-word line driver 32L not shown. The remaining sub-word lines SWL1, SWL3, SWL5, and SWL7 are connected to the sub-word line driver 32R disposed opposed to the sub-word line driver 32L with the memory cell array 31 sandwiched between the sub-word line drivers 32R and 32L.

Word line potential stabilization transistor control signal lines PDOa, PDOb, and a power supply line VKK are wired in a direction which crosses the sub-word lines SWL0 to SWL7. The control signal lines PDOa and PDOb are signal lines having a same potential, both of which are supplied from the stabilization circuit control signal generation circuit 55L. These control signal lines PDOa, PDOb, and power supply line VKK are on a same wiring layer as gate electrodes.

N+ diffusion layers, which are N-type diffusion layers having a relatively high concentration, are formed in a semiconductor substrate surface around a region where the control signal line PDOb and the sub-word lines SWL1 and SWL5 cross and a region where the control signal line PDOa and the sub-word lines SWL3 and SWL7 cross.

Immediately below the control signal line PDOb which crosses the sub-word lines SWL1 and SWL5, channels of transistors T1 and T5 are formed. Similarly, immediately below the control signal line PDOa which crosses the sub-word lines SWL3 and SWL7, channels of transistors T3 and T7 are formed. In the N+ diffusion layers, a drain region for each of the transistors T1 and T5 is formed in a region 61R on the side of the memory cell array 31 from the control signal line PDOb, a drain region for each of the transistors T3 and T7 is formed in a region 61L sandwiched between the control signal line PDOa and the power supply line VKK, and a source region 62 for each of the transistors T1, T3, T5, and T7 is formed in a region 62 between the control signal line PDOa and the control signal line PDOb. The source region 62 and the line VKK are connected via a contact 63 and the lines. The ends of the sub-word lines SWL1, SWL3, SWL5, and SWL7 wired from the memory cell array 31 are respectively connected to drains of the transistors T1, T3, T5, and T7 via the contact 63. Depending on the configuration of the stabilization control signal generation circuit 55L, the control signal lines PDOa and PDOb may be different control signal lines from each other.

Figure 4:
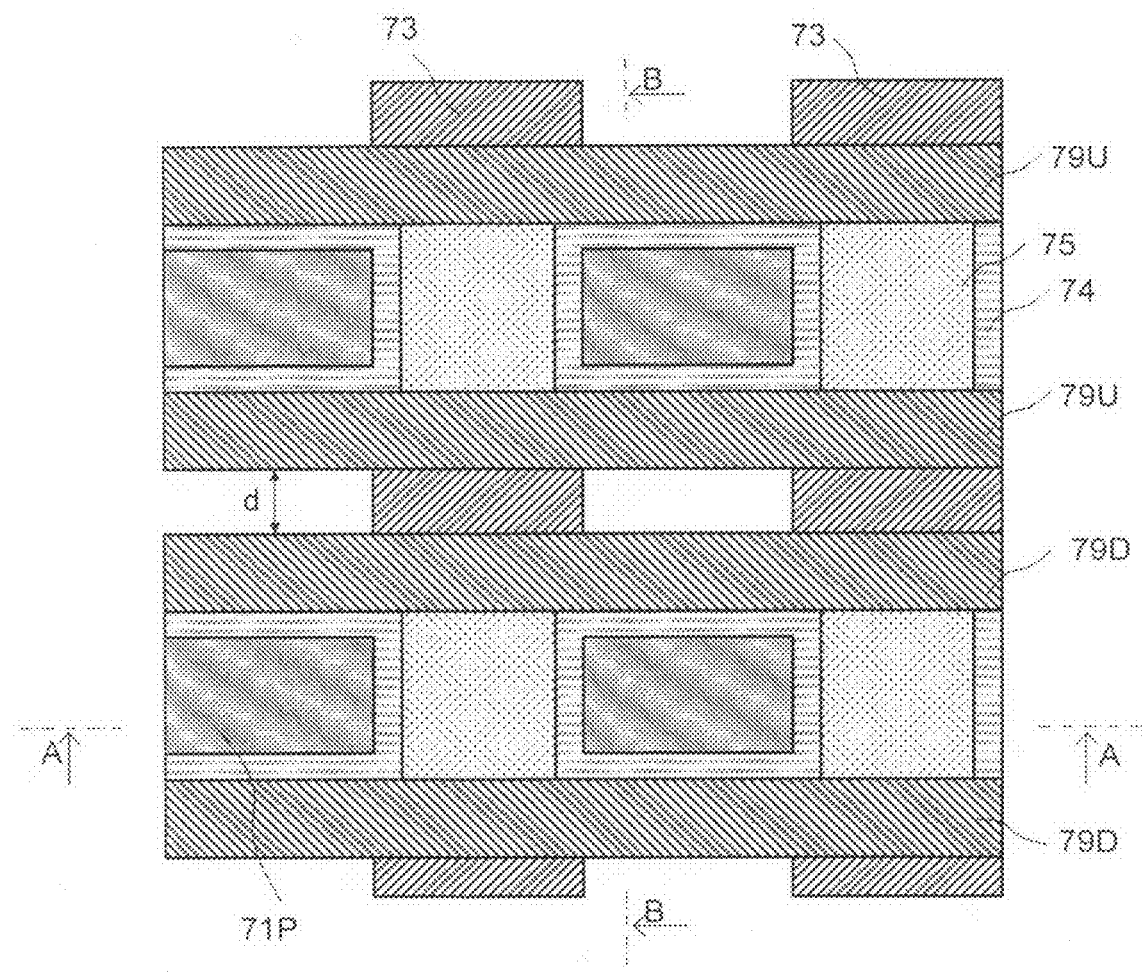
FIG. 4 is a plan view showing a structure of a memory cell array in the first example.
Figure 5A:
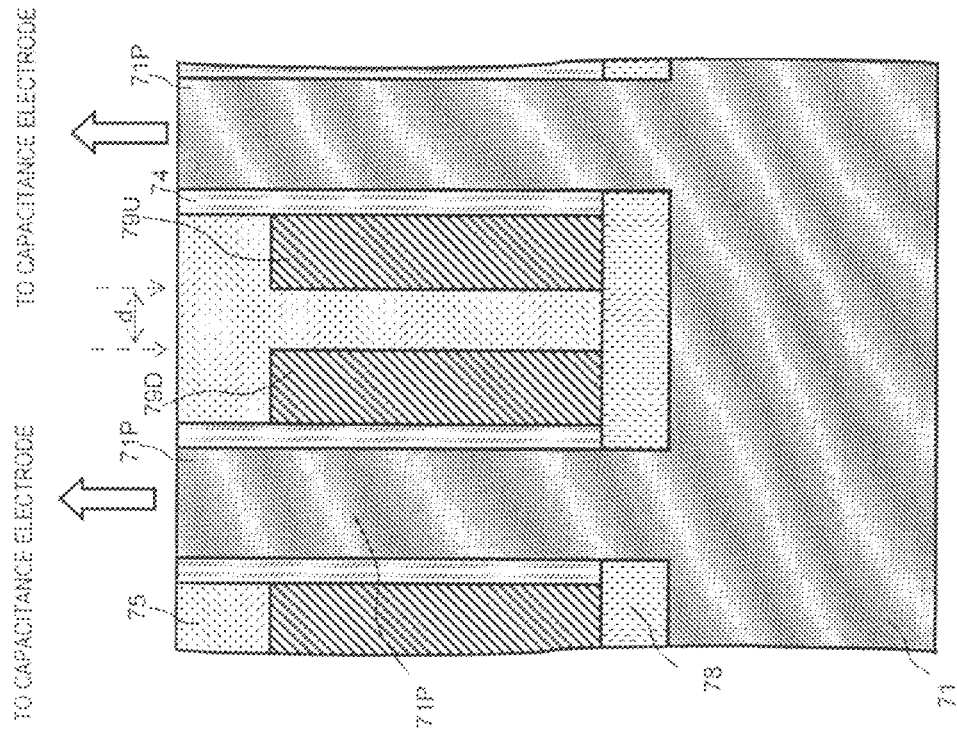
FIG. 5A is a sectional view taken along an A-A line of the memory cell array in FIG. 4.
Figure 5B:
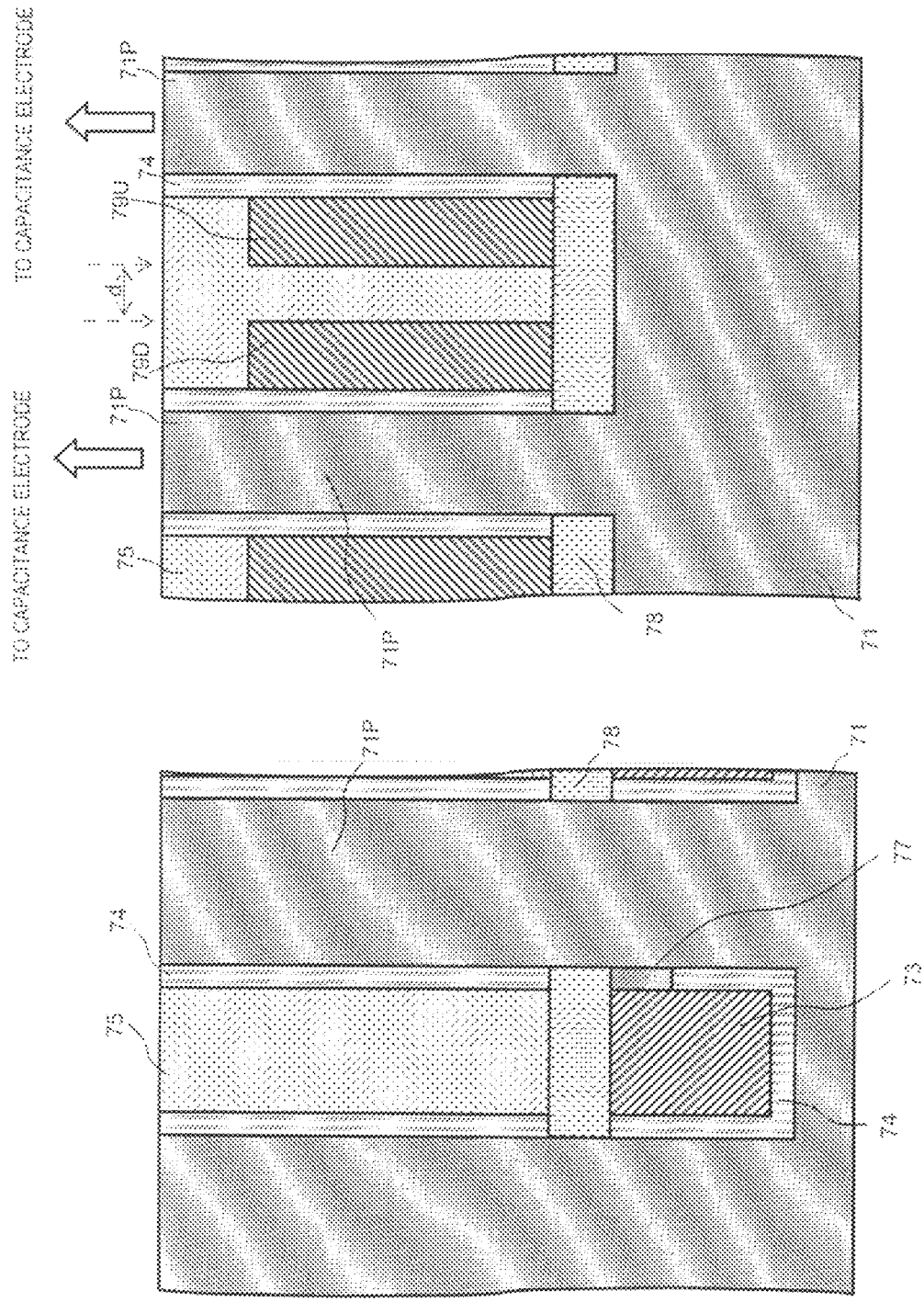
FIG. 5B is a sectional view taken along a B-B line of the memory cell array in FIG. 4.

FIG. 4 is a plan view showing a region of a part of the memory cell array 31 in the first example. FIG. 5A is a sectional view taken along a line A-A in FIG. 4, and FIG. 5B is a sectional view taken along a line B-B in FIG. 4. The structure of the DRAM cell in the first example will be described, using FIGS. 4, 5A and 5B. Buried bit lines 73 are formed in a P-type semiconductor substrate 71. The buried bit lines 73 are formed to be insulated from the P-type semiconductor substrate 71 by a thermal oxide film 74. Semiconductor pillars partially projecting from the surface of the P-type semiconductor substrate are provided on the surface of the P-type semiconductor substrate, and each tip of the semiconductor pillars are connected to a capacitance electrode not shown. A buried bit line connection unit 77 formed of silicide is provided between the buried bit line 73 and the semiconductor pillar 71P to connect the semiconductor pillar 71P to the buried bit line 73 corresponding to the semiconductor pillar 71p. An insulating film 78 formed by HDP is formed on a surface of the buried bit line. Further, sub-word lines 79U and 79D, which become gate electrodes of cell transistors, are wired on sidewalls of the semiconductor pillar 71P on the insulating film 78, through gate oxide films.

The above-mentioned DRAM cell has the structure of a so-called 4F2 cell in which bit lines can be arranged with minimum intervals of 2F and word lines can be arranged with the minimum intervals of 2F. In the above-mentioned structure, the sub-word lines 79U and 79D run side by side with a short interval (refer to reference numeral d in FIGS. 4, 5A and 5BB). Thus, the distance between the sub-word lines is shorter than in a layout structure of a conventional 6F2 cell or 8F2 cell in which a cell contact is disposed between sub-word lines. Accordingly, an increase in a parasitic capacitance between the sub-word lines cannot be avoided. In a layout using the 6F2 cell, for example, a ratio of a parasitic capacitance between the adjacent sub-word lines to overall sub-word line parasitic capacitances is 1% or less. On contrast therewith, in a layout using the 4F2 cell, a ratio of the parasitic capacitance between the adjacent sub-word lines to overall sub-word line parasitic capacitances ranges from 15 to 20%.

TABLE 1

| Ratio of Parasitic Capacitance between Adjacent Sub-word lines to Overall Sub-word Line Parasitic Capacitances ||
| --- | --- |
| Layout Structure of DRAM Cell ||
| F54 6F2 | F45 4F2 |
| 1% or Less | 15-20% |

Accordingly, when the layout is made using the DRAM cell of the structure of the 4F2 cell as in the first example, an influence caused by an adjacent sub-word line can be effectively suppressed while making full use of the advantage of the layout which utilizes the 4F2 cells to reduce the area of the semiconductor memory device.

Figure 6:
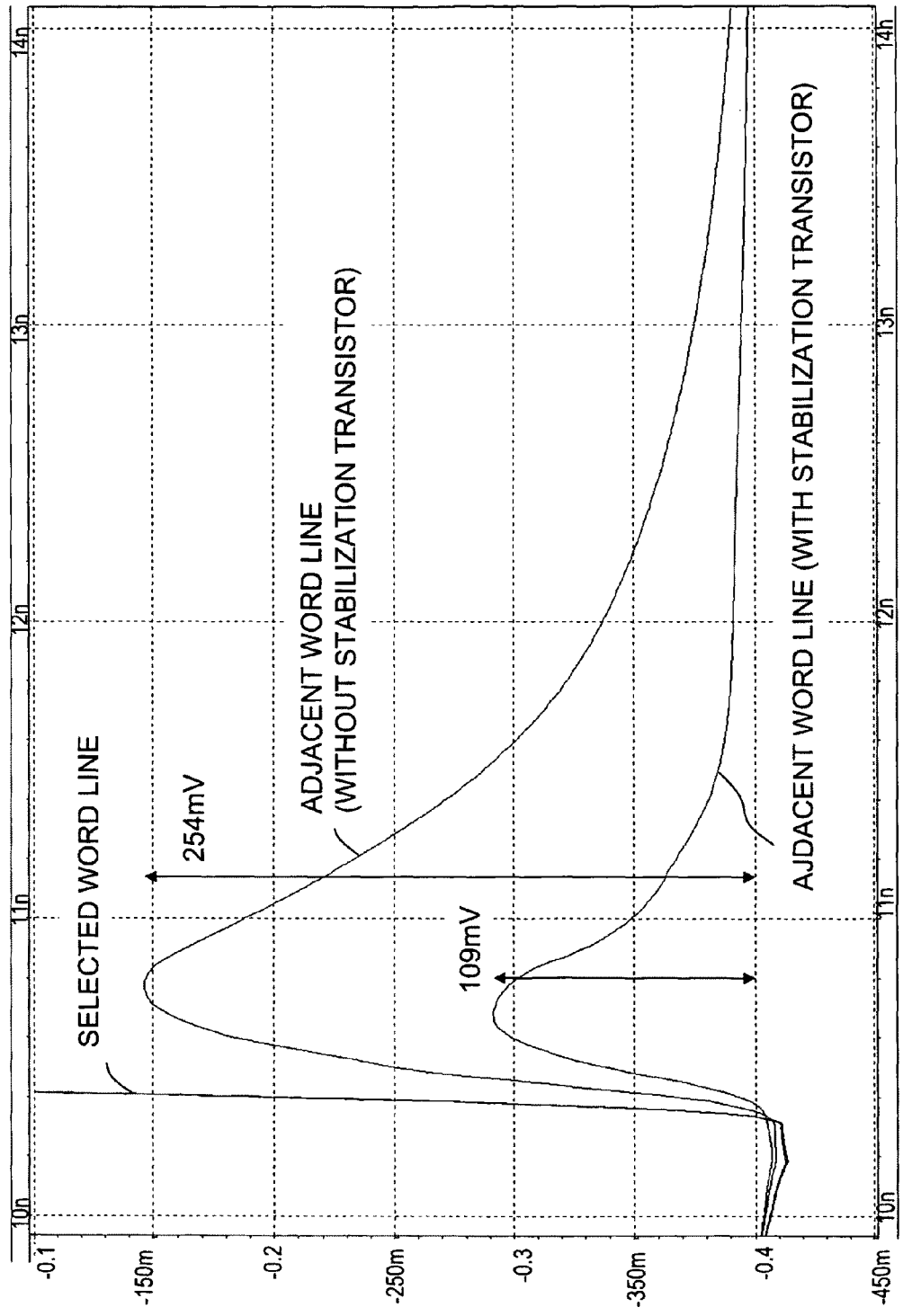
FIG. 6 is a simulation waveform diagram showing an effect of the first example.

Next, the effect of the first example will be described. FIG. 6 is a graph comparing simulation waveforms of potentials of the sub-word lines adjacent to the selected sub-word line when the 4F2 DRAM cell as shown in FIGS. 4, 5A and 5B is used. This graph shows the simulation waveforms of the potentials of the sub-word lines adjacent to the selected sub-word line when the sub-word line potential stabilization transistor is provided as in the first example and the sub-word line potential stabilization transistor is not provided. As shown in FIG. 6, when the stabilization transistor is not provided and when the selected sub-word line is activated, the potential of the non-selected sub-word line adjacent to the selected sub-word line has a peak value of approximately 254 mV, which has floated from the VKK potential (−0.4V). On contrast therewith, by providing the sub-word line potential stabilization transistor as in the first example, floating of the potential of the non-selected sub-word line adjacent to the selected sub-word line from the VKK potential can be reduced to approximately 109 mV at its peak value. With this arrangement, leak current with respect to the cell capacitance due of floating of the non-selected sub-word line can be suppressed. A refresh characteristic can be thereby improved during a data holding period of the memory cell.

The first example shows an example of the semiconductor memory device having a large storage capacity in which the memory banks 20 are provided inside the semiconductor memory device 10, and each memory bank includes the plurality of the memory cell array units 30 arranged in the matrix form. The invention can also be applied to a semiconductor memory device having a small capacity in which only one memory cell array is provided for the overall semiconductor memory device. In that case, there is no need for dividing a main word line into sub-word lines for each memory cell array. Thus, the sub-word line in the first example can be applied to a word line without alteration.

Second Example

Figure 7A:
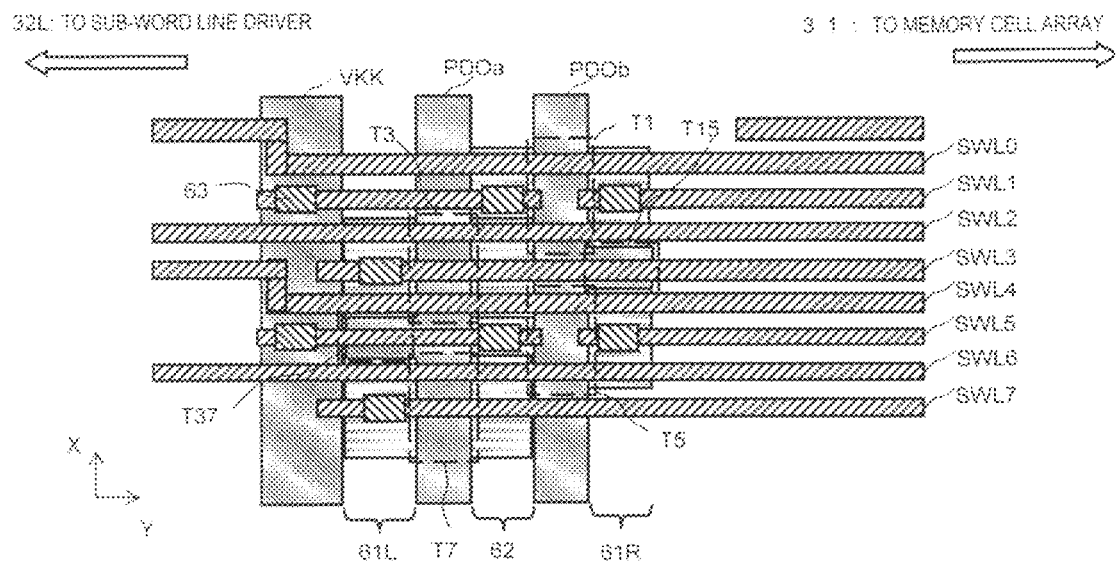
FIG. 7A is a layout diagram showing an example of circuit arrangement of a part of a word line potential stabilization circuit in a second example.
Figure 7B:
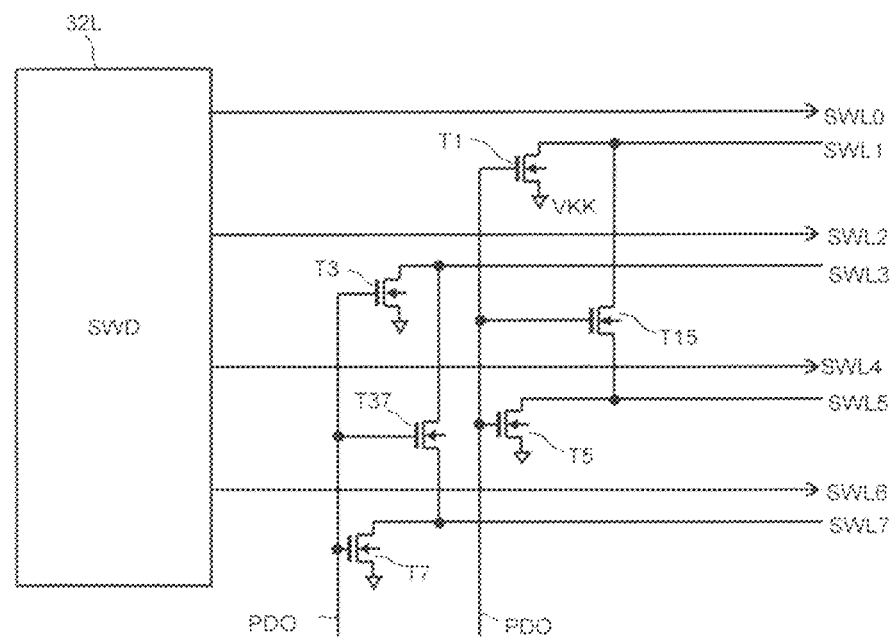
FIG. 7B is an equivalent circuit of FIG. 7A.

FIG. 7A is a layout diagram showing a circuit arrangement example of a part of a word line potential stabilization circuit in a semiconductor memory device in a second example, and FIG. 7B is an equivalent circuit of FIG. 7A. A configuration of the semiconductor memory device in the second example is the same as the configuration in the first example except an internal configuration and layout of the sub-word line potential stabilization circuit. Thus, only a difference from the first example will be described. Same reference numerals are assigned to components which are substantially the same as those in the first example. Detailed descriptions of the substantially same components will be omitted.

In the semiconductor memory device in the second example shown in FIGS. 7A and 7B, a control signal line PDOb (line on a same wiring layer as gate electrodes) extends to a portion of a drain region 61R below a sub-word line SWL3, where a channel of an N-type MOS transistor T15 is formed. The N-type MOS transistor T15 is newly provided between a drain region of a transistor T1 connected to a sub-word line SWL1 and a drain region of a transistor T5 connected to a sub-word line SWL5.

Similarly, a control signal line PDOa on a same wiring layer as the gate electrodes extends to a portion of a drain region 61L between sub-word lines SWL4 and SWL6, where a channel of an N-type MOS transistor T37 is formed. The N-type MOS transistor T37 is newly provided between a drain region of a transistor T3 connected to a sub-word line SWL3 and a drain region of a transistor T7 connected to a sub-word line SWL7.

According to the second example mentioned above, when a specific sub-word line (such as a sub-word line SWL2) is activated, sub-word lines (SWL1 and SWL3) adjacent to the specific sub-word line (SWL2) are connected to sub-word lines (SWL5 and SWL7) not adjacent to the specific sub-word line (SWL2) by sub-word line potential stabilization transistors (T15, T37). Thus, potentials of sub-word lines adjacent to a selected sub-word line can be stabilized by a non-selected potential. As can be understood by comparison between FIG. 3 in the first example and FIGS. 7A and 7B in the second example, the sub-word line potential stabilization transistors T15 and T37 are further added to the first example. However, there is no increase in the layout area caused by addition of the sub-word line potential stabilization transistors T15 and T37.

Third Example

Figure 8A:
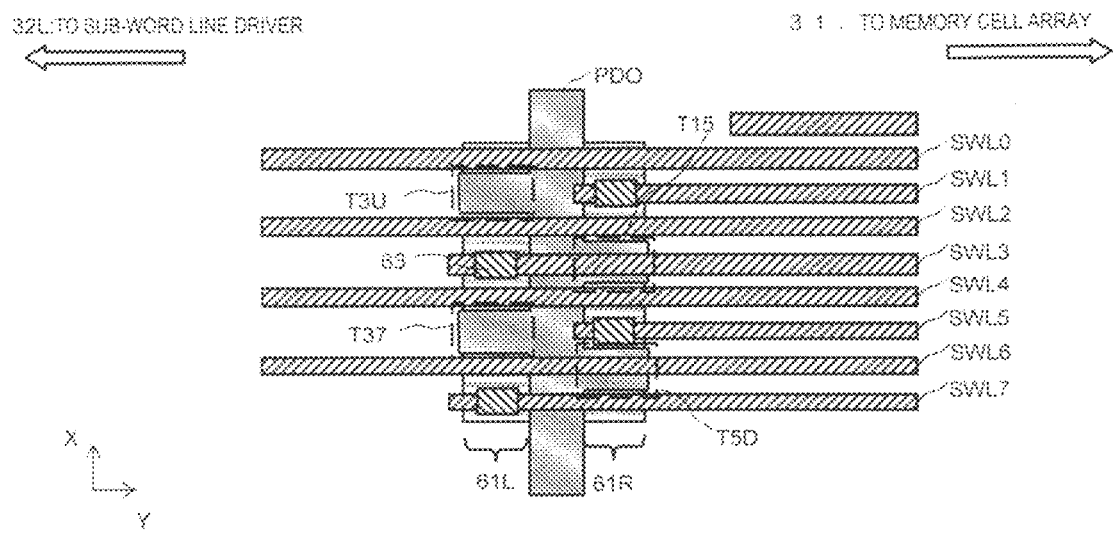
FIG. 8A is a layout diagram showing an example of circuit arrangement of a part of a word line potential stabilization circuit in a third example.
Figure 8B:
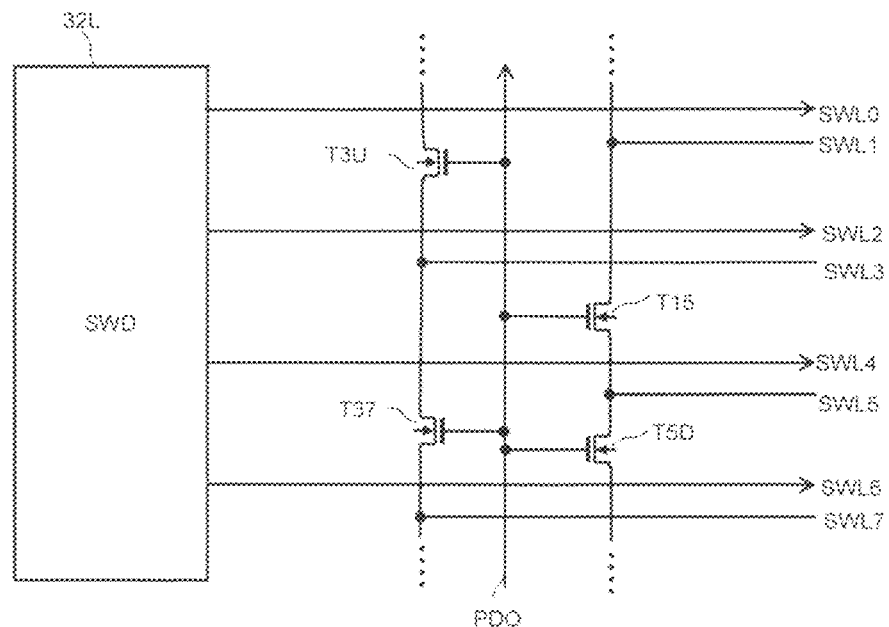
FIG. 8B is an equivalent circuit of FIG. 8A.

FIG. 8A is a layout diagram showing a circuit arrangement example of a part of a word line potential stabilization circuit in a semiconductor memory device in a third example, and FIG. 8B is an equivalent circuit of FIG. 8A. A configuration of the semiconductor memory device in the third example is the same as the configuration in the first example except an internal configuration and layout of the sub-word line potential stabilization circuit. Thus, only a difference from the first example will be described. Same reference numerals are assigned to components which are substantially the same as those in the first example. Detailed descriptions of the substantially same components will be omitted.

In the first example, the sub-word line potential stabilization transistors T1, T3, T5, and T7 connect the corresponding sub-word lines (SWL1, SWL3, SWL5, SWL7) to the power supply VKK. On contrast with therewith, sub-word line potential stabilization 25, transistors T3U, T15, T37, and T5D in the third example connect non-selected sub-word lines adjacent to a selected sub-word line to other sub-word lines not adjacent to the selected sub-word line. With such connection, the need for routing to the power supply VKK in the sub-word line potential stabilization circuits 33L and 33R is eliminated. As shown in FIG. 8A, the layout area of each of the sub-word line potential stabilization circuits 33L and 33R can be reduced more than in FIG. 3A by an amount corresponding to elimination of the need for routing to the power supply VKK.

When a sub-word line driver unit 32L selects and activates one of sub-word lines in the third example, for example, a stabilization control signal generation circuit 55L disposed in a cross area 36 activates a control signal line PDO. When the control signal line PDO is activated, all of the sub-word line potential stabilization transistors T3U, T37, T15, T5D in FIG. 8B turn on.

When the sub-word line driver unit 32L selects a sub-word line SWL4, for example, the sub-word line SWL3 adjacent to the sub-word line SWL4 is connected to the sub-word line SWL7 and a non-selected sub-word line not shown due to turning on of the sub-word line potential stabilization transistors T3U and T37. A sub-word line driver unit 32R for the non-selected sub-word lines connects the sub-word lines to a power supply voltage VKK. Thus, the sub-word line SWL3 is fixed to the stabilized potential (potential of the power supply VKK). Similarly, another sub-word line SWL5 adjacent to the selected sub-word line SWL4 is also fixed to the stabilized potential (potential of the power supply VKK) due to the sub-word line potential stabilized transistors T15 and T5D.

As described above, in the third example, an effect similar to that in the first example can be realized by the circuit of which the layout area can be reduced more than in the first example.

Fourth Example

Figure 9:
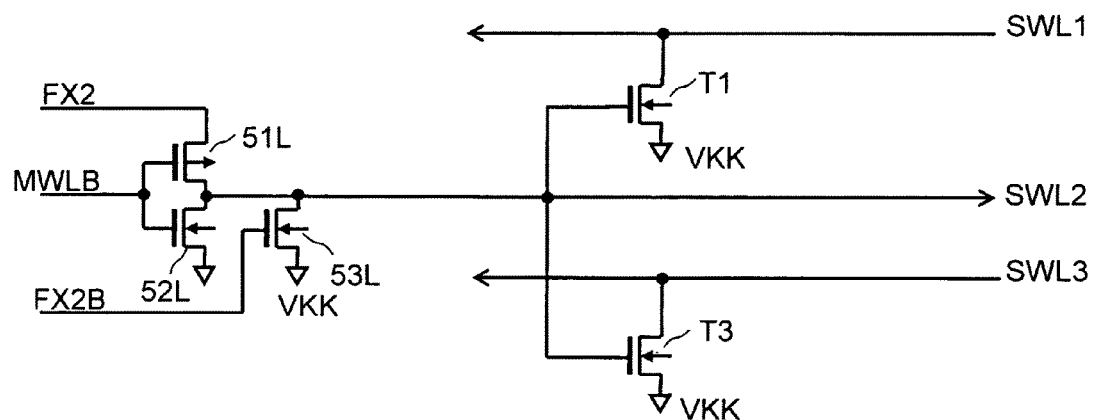
FIG. 9 is a block diagram showing a circuit configuration of a part of a word line potential stabilization circuit in a fourth example.

FIG. 9 is a block diagram showing a circuit configuration of a part of a word line potential stabilization circuit in a fourth example. In the first to third examples, each of the control signal lines (PDO, PDE, and the like) for controlling the word line potential stabilization circuits is generated by decoding the sub-word selection line and the like by a corresponding one of the stabilization circuit control signal generation circuit 55L and 55R disposed in the cross areas 36 (refer to FIG. 1). However, the size of the cross area 36 is determined by layout widths of each word line driver and each sense amplifier. It is necessary to dispose a circuit other than each of the stabilization circuit control signal generation circuits 55L and 55R in the cross area 36, and there may be no room for disposing each of the stabilization circuit control signal generation circuits 55L and 55R. In the fourth example, turning on or off of sub-word line potential stabilization transistors (refer to transistors T1 and T3 in FIG. 9) is directly controlled by an adjacent sub-word line. With such a circuit configuration, the overall layout area of the sub-word line driver and sub-word line potential stabilization circuit can be further reduced.

In the fourth example as well, sub-word line adjacent to a selected sub-word line can be connected to non-selected sub-word lines not adjacent to the selected sub-word line by the sub-word line potential stabilization transistors, or the sub-word line potential stabilization circuit can be configured to be the one not using a power supply VKK, as in the second and third examples.

The present invention can be used for a semiconductor memory device such as a DRAM or an SRAM having a comparatively small capacity as well as a DRAM with a large capacity. In particular, the DRAM cell of a 4F2 type shown in FIGS. 4, 5A and 5B just shows an example of a memory cell structure whereby the effect of the present invention can be obtained. The present invention can be widely applied to a semiconductor memory device in which a parasitic capacitance between word lines is relatively large It should be noted that other objects, features and aspects of the present invention will become apparent in the entire disclosure and that modifications may be done without departing the gist and scope of the present invention as disclosed herein and claimed as appended herewith.

Also it should be noted that any combination or selection of the disclosed and/or claimed elements, matters and/or items may fall under the modifications aforementioned.

What is claimed is:

1. A device comprising:
a plurality of word lines each extending in a first direction, each of the word lines including a first end portion and a second end portion, the word lines being arranged in a second direction crossing the first direction to include a first edge word line, a second edge word line and one or more intermediate word lines between the first and second edge word lines;
a plurality of drivers each connected to the first end portion of an associated one of the word lines, a selected one of the drivers driving a selected one of the word lines to an active level and remaining ones of the drivers driving remaining ones of the word lines to an inactive level, respectively; and
a plurality of transistors each connected to the second end portion of an associated one of the word lines, the transistors being controlled so that one of the transistors, which is connected to the selected one of the word lines, is rendered non-conductive and that at least one of remaining ones of the transistors, which is connected to at least one of the remaining ones of the word lines that is contiguous to the selected one of the word lines, is rendered conductive;
wherein the drivers are divided into first and second groups and the transistors are divided into third and fourth groups, the drivers belonging to the first group being connected to odd-numbered ones of the word lines, respectively, the drivers belonging to the second group being connected to even-numbered ones of the word lines, respectively, the transistors belonging to the third group being connected to the even-numbered ones of the word lines, respectively, the transistors belonging to the fourth group being connected to the odd-numbered ones of the word lines, respectively, each of the transistors belonging to the third group being rendered conductive when one of the drivers belonging to the first group drives an associated one of the odd-numbered ones of the word lines, and each of the transistors belonging to the fourth group being rendered conductive when one of the drivers belonging to the second group drives an associated one of the even-numbered ones of the word lines;
wherein each of the transistors is connected to an associated one of the word lines and a potential line supplied with the inactive level to supply, when rendered conductive, the inactive level to the associated one of the word line so that each of the remaining ones of the word lines is driven to the inactive level by an associated one of the remaining drives and by an associated one of the transistors;
wherein the device further comprises first and second signal generating circuits, the first signal generation circuit generating a first control signal to render conductive each of the transistors belonging to the third group, and the second signal generation circuit generating a second control signal to render conductive each of the transistors belonging to the fourth group; and
wherein the device further comprises a plurality of additional transistors, the additional transistors being divided into fifth and sixth groups, each of the additional transistors belonging to the fifth group being connected between different two of even-numbered ones of the word lines and rendered conductive in response to the first control signal, and each of the additional transistors belonging to the sixth group being connected between different two of odd-numbered ones of the word lines and rendered conductive in response to the second control signal.

2. The device according to claim 1,
wherein the device further comprises:
a plurality of bit lines each extending in the second direction, the bit lines being arranged in the first direction to include a first edge bit line, a second edge bit line and one or more intermediate bit lines between the first and second edge bit lines; and
a plurality of memory cells each coupled to an associated one of the word lines and an associated one of the bit lines; and
wherein ones of the transistors, which are connected to odd-numbered ones of the word lines, are disposed in the second direction along the first edge bit line, and remaining ones of the transistors, which are connected to even-numbered ones of the word lines, are disposed in the second direction along the second edge bit line.

3. The device according to claim 2, wherein ones of the drivers, which are connected to the odd-numbered ones of the word lines, are disposed in the second direction along the second edge bit line, and remaining ones of the drivers, which are connected to the even-numbered ones of the word lines, are disposed in the second direction along the first edge bit line.

4. The device as claimed in claim 3, further comprising a plurality of sense amplifiers each connected to an associated one of the bit lines, ones of the sense amplifiers, which are connected respectively to odd-numbered ones of the bit lines, are disposed in the first direction along the first edge word line, and remaining ones of the sense amplifiers, which are connected respectively to even-numbered ones of the bit lines, are disposed in the first direction along the second edge word line.

5. The device as claimed in claim 3, further comprising a voltage line supplied with a negative voltage lower than a ground potential, each of the transistors being connected between an associated one of the word lines and the voltage line to supply, when rendered conductive, the negative voltage to the associated one of the word lines.

6. The device as claimed in claim 5, wherein each of the drivers includes a driving transistor connected between an associated one of the word line and the voltage line, and the driving transistor of each of the remaining ones of the drivers supplies the negative voltage to each of the remaining ones of the word lines as the inactive level.

7. The device as claimed in claim 4, further comprising a voltage line supplied with a negative voltage lower than a ground potential, each of the transistors being connected between an associated one of the word lines and the voltage line to supply, when rendered conductive, the negative voltage to the associated one of the word lines.

8. The device as claimed in claim 7, wherein each of the drivers includes a driving transistor connected between an associated one of the word line and the voltage line, and the driving transistor of each of the remaining ones of the drivers supplies the negative voltage to each of the remaining ones of the word lines as the inactive level.

9. The device as claimed in claim 1, further comprising a voltage line supplied with a negative voltage lower than a ground potential, each of the transistors being connected between an associated one of the word lines and the voltage line to supply, when rendered conductive, the negative voltage to the associated one of the word lines.

10. A device comprising:
a plurality of word lines each extending in a first direction, the word lines being arranged in a second direction crossing the first direction to include odd-numbered word lines and even-numbered word lines;
a plurality of bit lines each extending in the second direction, the bit lines being arranged in the first direction to include a first edge bit line, a second edge bit line and one or more intermediate bit lines between the first and second edge bit lines;
a plurality of memory cells each coupled to an associated one of the odd-numbered and even-numbered word lines and an associated one of the bit lines;
a first driver array including a plurality of first drivers and a second driver array including a plurality of second drivers, the first drivers being connected respectively to the odd-numbered word lines and disposed in the second direction along the first edge bit line, the second drivers being connected respectively to the even-numbered word lines and disposed in the second direction along the second edge bit line, the first and second drivers being configured such that one of the first and second drivers drives an associated one of the odd-numbered and even-numbered word lines to an active level and each of remaining ones of the first and second drivers drives each of remaining ones of the odd-numbered and even-numbered word lines to an inactive level;
a plurality of first transistors disposed between the first driver array and the first edge bit line and supplied at gates thereof in common with a first control signal, the first control signal rendering each of the first transistors conductive when one of the first drivers drives an associated one of the odd-numbered word lines, each of the first transistors being connected between associated two of the even-numbered word lines, one of the associated two of the even-numbered word lines being contiguous to one of the odd-numbered word lines and the other of the associated two of the even-numbered word lines being distant from the one of the add-numbered word lines and contiguous to another one of odd-numbered word lines; and
a plurality of second transistors disposed between the second driver array and the second edge bit line and supplied at gates thereof in common with a second control signal, the second control signal rendering each of the second transistors conductive when one of the second drivers drives an associated one of the even-numbered word lines, each of the second transistors being connected between associated two of the odd-numbered word lines, one of the associated two of the odd-numbered word lines being contiguous to one of the even-numbered word lines and the other of the associated two of the odd-numbered word lines being distant from the one of the even-numbered word lines and contiguous to another one of even-numbered word lines.

11. The device as claimed in claim 10, further comprising:
a potential line supplied with the inactive level;
a plurality of third transistors disposed between the first driver array and the first edge bit line and supplied at gates thereof in common with the first control signal, the first control signal rendering each of the third transistors conductive when one of the first drivers drives an associated one of the odd-numbered word lines, and each of the third transistors being connected between an associated one of the even-numbered word lines and the potential line; and
a plurality of fourth transistors disposed between the second driver array and the second edge bit line and supplied at gates thereof in common with the second control signal, the second control signal rendering each of the fourth transistors conductive when one of the second drivers drives an associated one of the even-numbered word lines, and each of the fourth transistors being connected between an associated one of the odd-numbered word lines and the potential line.

12. The device as claimed in claim 11, wherein each of the first and second drivers comprises:
a signal line operatively supplied with the active level;
a fifth transistor connected between the signal line an associated one of the odd-numbered and even-numbered word lines;
a sixth transistor connected between the potential line and the associated one of the odd-numbered and even-numbered word lines; and
a seventh transistor connected in parallel to the sixth transistor between the potential line and the associated one of the odd-numbered and even-numbered word lines;
the fifth transistor being rendered conductive and each of the sixth and seventh transistors being rendered nonconductive to drive the associated one of the odd-numbered and even-numbered word lines to the active level; and
the fifth transistor being rendered nonconductive and at least the seventh transistor being rendered conductive to drive the associated one of the odd-numbered and even-numbered word lines to the inactive level.

13. The device as claimed in claim 12, wherein the active level is a positive potential higher than a ground potential and the inactive level is a negative potential lower than the ground potential.

14. The device as claimed in claim 10, wherein each of the first transistors includes first source and drain regions that are connected respectively to the associated two of the even-numbered word lines and define a first channel region therebetween and a first gate electrode that is formed over the channel region and supplied with the first control signal, the first gate electrode being located under an odd-numbered word line that is different from each of the one of the odd-numbered word lines and the another one of odd-numbered word lines, and each of the second transistors includes second source and drain regions that are connected respectively to the associated two the odd-numbered word lines and define a second channel region therebetween and a second gate electrode that is formed over the channel region and supplied with the second control signal, the second gate electrode being located under an even-numbered word line that is different from each of the one of the even-numbered word lines and the another one of even-numbered word lines.

15. A device comprising:
a plurality of word lines each extending in a first direction, the word lines being arranged in a second direction crossing the first direction to include odd-numbered word lines and even-numbered word lines;
a plurality of bit lines each extending in the second direction, the bit lines being arranged in the first direction to include a first edge bit line, a second edge bit line and one or more intermediate bit lines between the first and second edge bit lines;
a plurality of memory cells each coupled to an associated one of the odd-numbered and even-numbered word lines and an associated one of the bit lines;
a first driver array including a plurality of first drivers and a second driver array including a plurality of second drivers, the first drivers being connected respectively to the odd-numbered word lines and disposed in the second direction along the first edge bit line, the second drivers being connected respectively to the even-numbered word lines and disposed in the second direction along the second edge bit line, the first and second drivers being configured such that one of the first and second drivers drives an associated one of the odd-numbered and even-numbered word lines to an active level and each of remaining ones of the first and second drivers drives each of remaining ones of the odd-numbered and even-numbered word lines to an inactive level;
a potential line supplied with the active level;
a plurality of first transistors disposed between the first driver array and the first edge bit line, each of the first transistors being connected between an associated one of the even-numbered word lines and the potential line and including a gate connected to an associated one of the odd-numbered word lines contiguous to the associated one of the even-numbered word lines so that when the associated one of the odd-numbered word lines is driven to the active level by a corresponding one of the first drivers, the associated one of the even-numbered word lines is supplied with the inactive level by the first transistors and by a corresponding one of the second drivers; and
a plurality of second transistors disposed between the second driver array and the second edge bit line, each of the second transistors being connected between an associated one of the odd-numbered word lines and the potential line and including a gate connected to an associated one of the even-numbered word lines contiguous to the associated one of the odd-numbered word lines so that when the associated one of the even-numbered word lines is driven to the active level by a corresponding one of the second drivers, the associated one of the odd-numbered word lines is supplied with the inactive level by the second transistors and by a corresponding one of the first drivers.

16. The device as claimed in claim 15, wherein each of the first and second drivers comprises:
a signal line operatively supplied with the active level;
a third transistor connected between the signal line and an associated one of the odd-numbered and even-numbered word lines;
a fourth transistor connected between the potential line and the associated one of the odd-numbered and even-numbered word lines;
a fifth transistor connected in parallel to the fourth transistor between the potential line and the associated one of the odd-numbered and even-numbered word line;
the third transistor being rendered conductive and each of the fourth and fifth transistors being rendered nonconductive to drive the associated one of the odd-numbered and even-numbered word lines to the active level; and
the third transistor being rendered nonconductive and at least the fifth transistor being rendered conductive to drive the associated one of the odd-numbered and even-numbered word lines to the inactive level.

17. The device as claimed in claim 16, wherein the active level is a positive potential higher than a ground potential and the inactive level is a negative potential lower than the ground potential.

18. The device as claimed in claim 15, wherein the fourth transistors includes a plurality of first pairs of transistors, the transistors in each of the first pairs including respective gates connected in common to an associated one of the odd-numbered word lines and are connected respectively to two of the even-numbered word lines that are contiguous to sandwich the associated one of the odd-numbered word lines, and the fifth transistors includes a plurality of second pairs of transistors, the transistors in each of the second pairs including respective gates connected in common to an associated one of the even-numbered word lines and are connected respectively to two of the odd-numbered word lines that are contiguous to sandwich the associated one of the even-numbered word lines.

* * * * *